United States Patent
Tran

[11] Patent Number: 5,943,579
[45] Date of Patent: Aug. 24, 1999

[54] METHOD FOR FORMING A DIFFUSION REGION IN A SEMICONDUCTOR DEVICE

[75] Inventor: Luan C. Tran, Meridian, Id.

[73] Assignee: Micron Technology, Inc., Boise, Id.

[21] Appl. No.: 08/799,233

[22] Filed: Feb. 14, 1997

[51] Int. Cl.$^6$ .................................................. H01L 21/331
[52] U.S. Cl. .......................... 438/370; 438/481; 438/514; 438/526
[58] Field of Search .................................... 438/150, 151, 438/163, 526, FOR 442, 370, 238, 48; 148/DIG. 20

[56] References Cited

U.S. PATENT DOCUMENTS

| | | |
|---|---|---|
| 3,761,319 | 9/1973 | Shannon . |
| 4,845,047 | 7/1989 | Holloway et al. . |
| 5,278,078 | 1/1994 | Kanebako et al. . |
| 5,407,839 | 4/1995 | Maruo . |
| 5,563,093 | 10/1996 | Koda et al. . |
| 5,563,098 | 10/1996 | Kuo et al. . |
| 5,578,507 | 11/1996 | Kuroi . |
| 5,593,906 | 1/1997 | Shimizu . |
| 5,663,080 | 9/1997 | Cereda et al. . |
| 5,674,770 | 10/1997 | Lee et al. . |
| 5,677,207 | 10/1997 | Ha . |
| 5,686,334 | 11/1997 | Sundaresan . |
| 5,700,727 | 12/1997 | Manning . |
| 5,719,081 | 2/1998 | Racanelli et al. . |
| 5,780,896 | 7/1998 | Ono . |
| 5,837,597 | 11/1998 | Saito . |
| 5,898,007 | 4/1999 | Lee . |

Primary Examiner—Richard Booth
Assistant Examiner—Jonathan Hack
Attorney, Agent, or Firm—Wells, St. John, Roberts, Gregory & Matkin P.S.

[57] ABSTRACT

A semiconductor processing method for forming a diffusion region is described and which includes providing a semiconductor substrate; forming a first layer of material over the semiconductor substrate; and after forming the first layer, ion implanting a conductivity modifying impurity through the first layer and into the semiconductor substrate to form a diffusion region therein. In an alternative form, a method for forming a field effect transistor is described and which includes providing a substrate; forming a field oxide region and active area region on the substrate; forming a gate dielectric layer atop the substrate and within the active area region; and after forming the gate dielectric layer, ion implanting a dopant impurity through the field oxide region and into the underlying substrate to form a field implant beneath the field oxide region for facilitating electrical isolation of the field effect transistor from adjacent electrical devices. In a third form of the invention, a method for forming a background dopant well relative to a semiconductor substrate is described and which includes providing a semiconductor substrate; forming a field oxide region on the semiconductor substrate; forming a gate dielectric layer atop the semiconductor substrate; forming a conductive gate layer atop the gate dielectric layer; and after forming the conductive gate layer, ion implanting through the field oxide region, gate dielectric layer, and conductive gate layer to form a background dopant well.

4 Claims, 11 Drawing Sheets

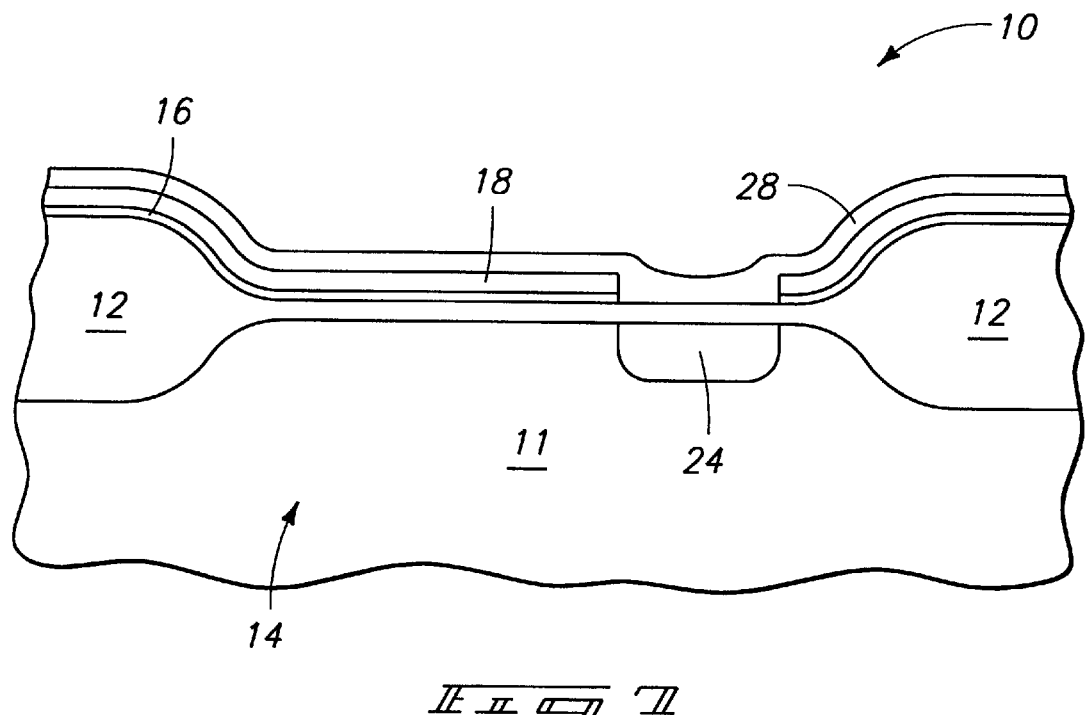
_FIG. 7_
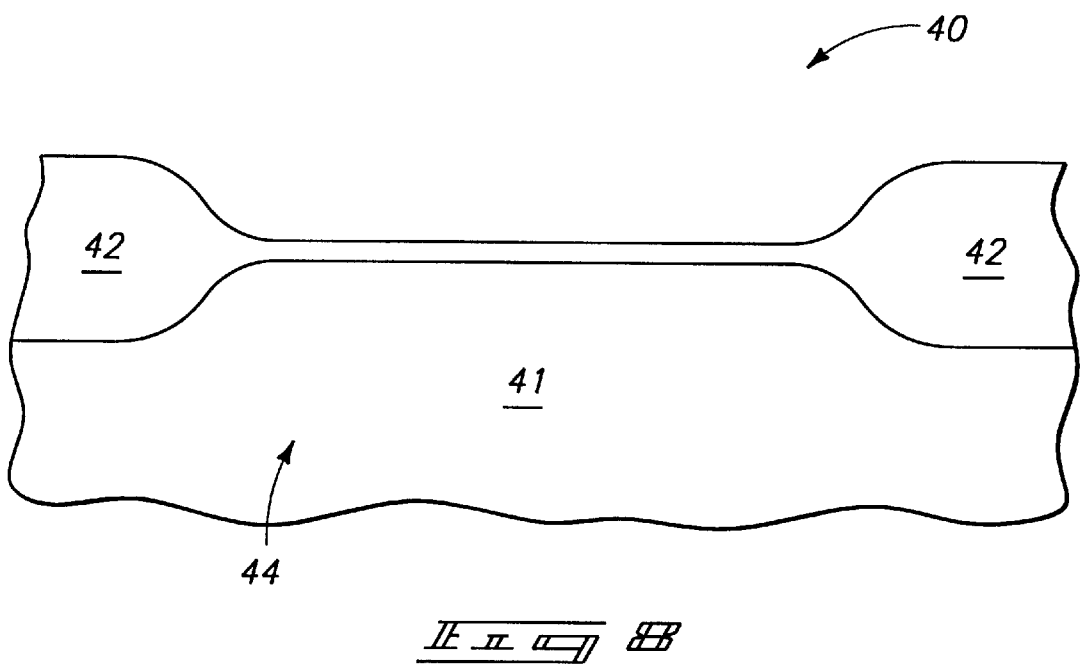
_FIG. 8_

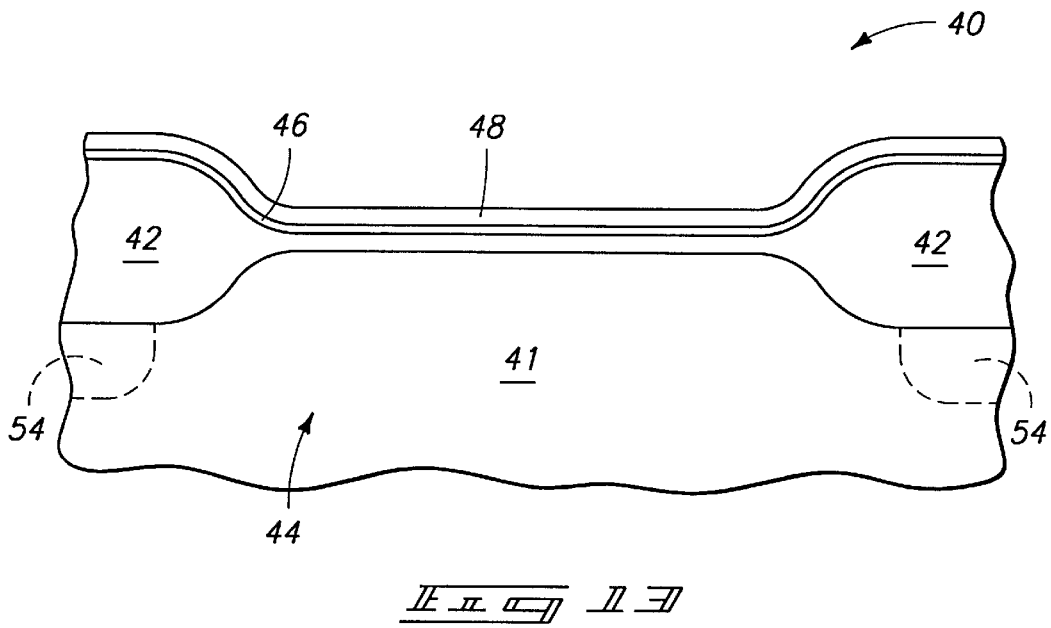
_FIG. 13_
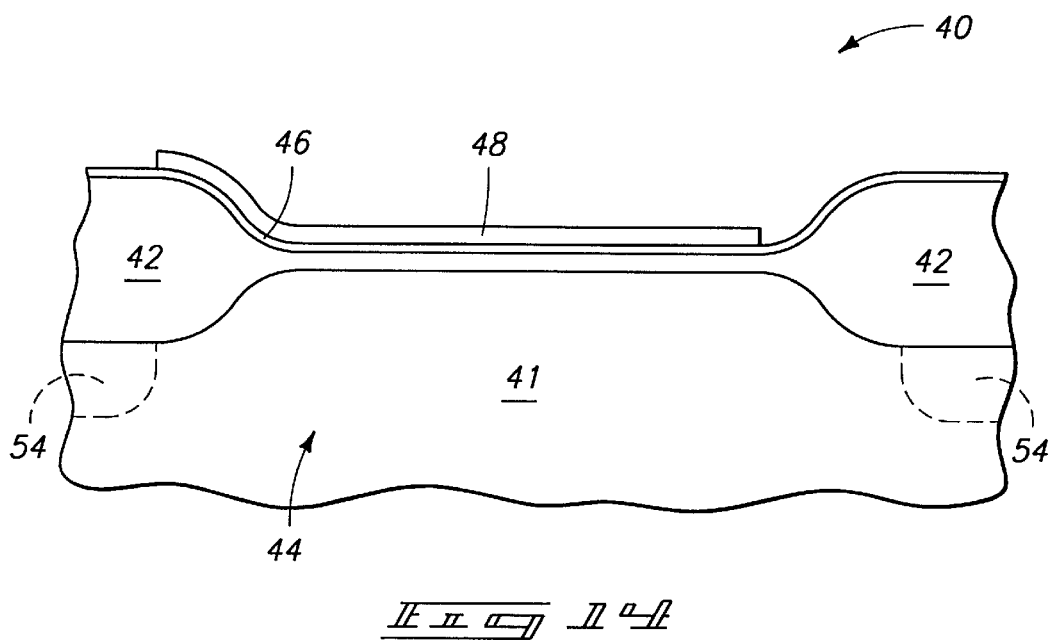
_FIG. 14_

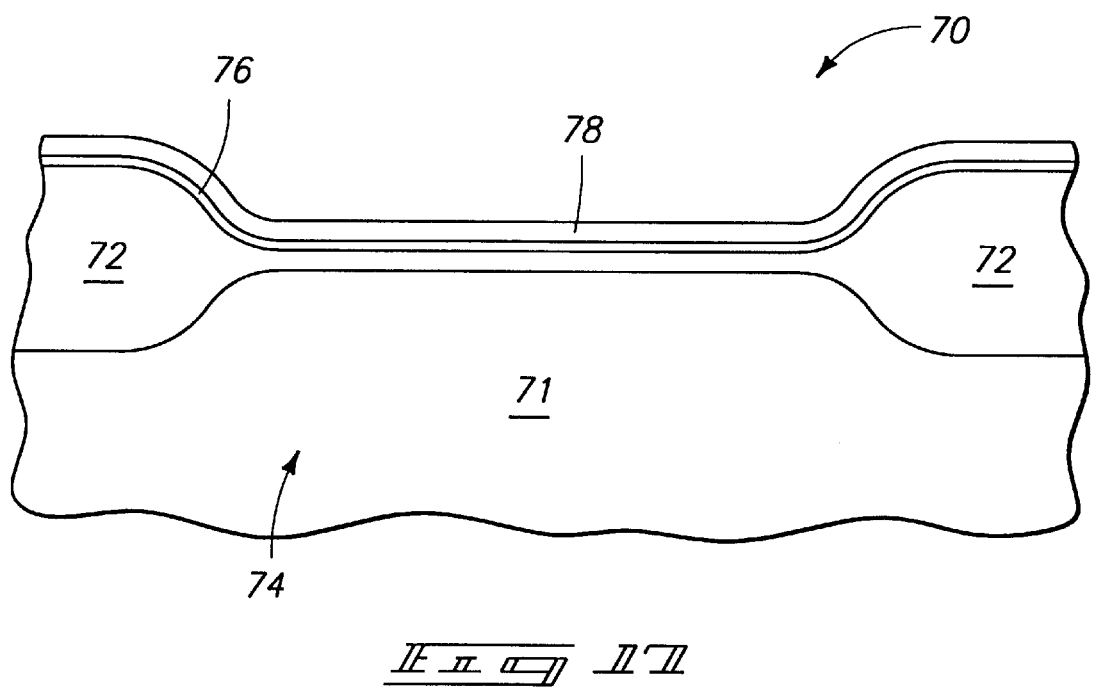
_FIG 17_
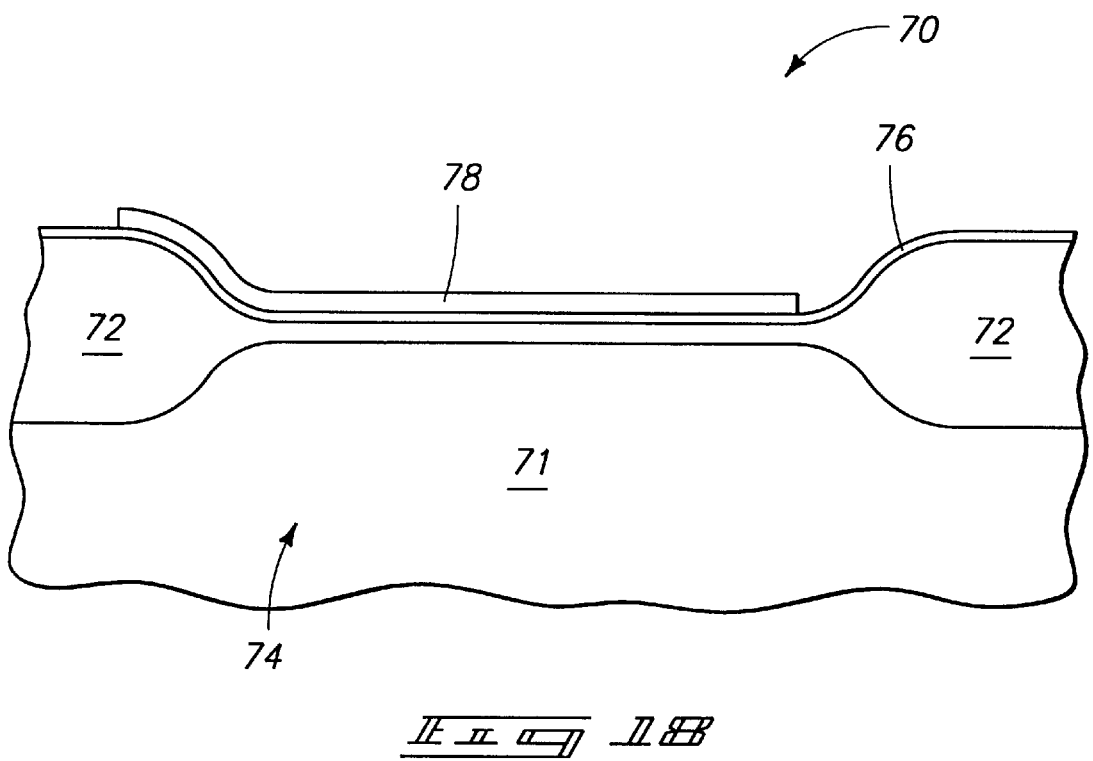
_FIG 18_

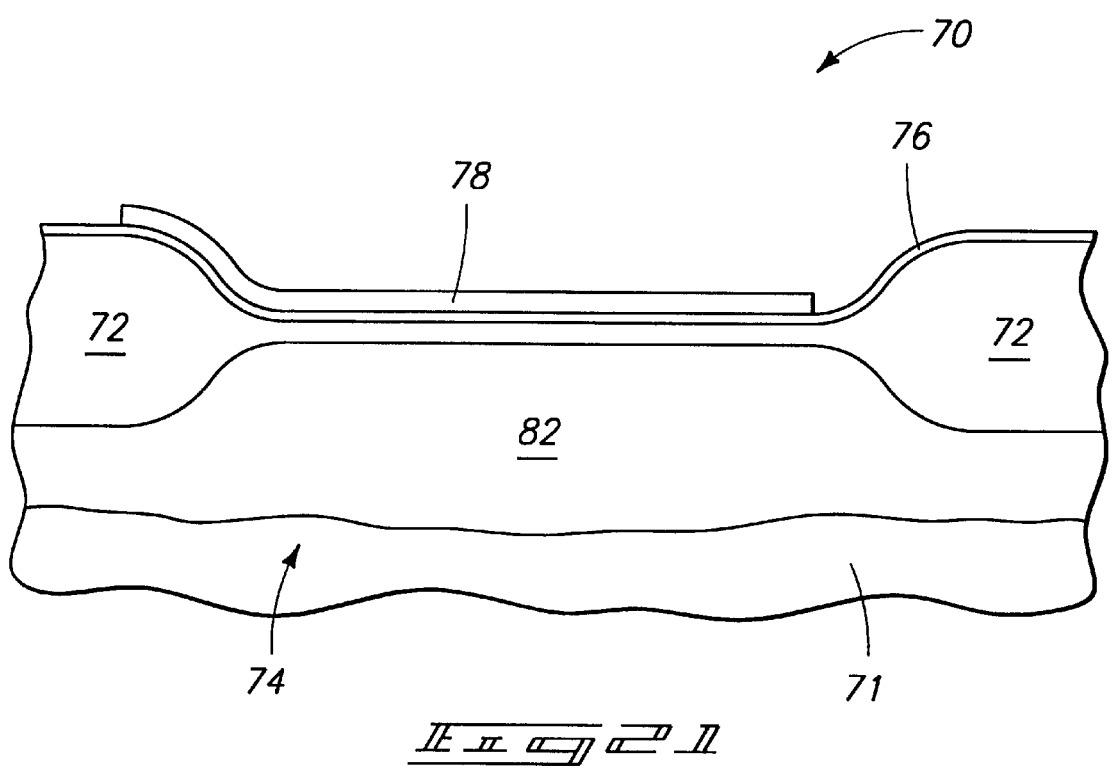

METHOD FOR FORMING A DIFFUSION REGION IN A SEMICONDUCTOR DEVICE

PATENT RIGHTS STATEMENT

This invention was made with Government support under Contract No. MDA 972-92-C-0054 awarded by Advanced Research Projects Agency (ARPA). Government has certain rights to this invention.

TECHNICAL FIELD

This invention relates specifically to the formation of diffusion regions in semiconductor devices.

BACKGROUND OF THE INVENTION

As circuitry density continues to increase, there is a corresponding drive to produce smaller and smaller field effect transistors. Field effect transistors have typically been formed by providing active areas within a bulk substrate material or within a complementary conductivity type well formed within a bulk substrate. One recent technique finding greater application in achieving reduced transistor size is to form field effect transistors with thin films, which are commonly referred to as "thin film transistor" (TFT) technology.

With thin film transistors, a substantially constant thickness film of material (typically polysilicon) is first provided. A central channel region of the thin film is masked while opposing adjacent source/drain regions are doped with appropriate P or N type conductivity enhancing impurities. A gate insulator and gate is provided either above or below the thin film channel region, thus providing a field effect transistor having active and channel regions formed entirely within a thin film as opposed to a bulk substrate. In the manufacturing of thin film transistors, field implants are provided beneath field oxide regions and are normally of the same conductivity type as the bulk/well type of the substrate for providing greater dopant concentration between the thin film transistors. This provides greater electrical isolation between adjacent transistors. Such higher dopant and implant regions are designed to be positioned immediately beneath the isolation field oxide regions. In the construction of these thin field transistors, such implants are normally immediately provided after field oxide formation and sacrificial oxide growth. However, conventional thermal processing of the semiconductor device subsequent to the formation of the implant regions has the effect of facilitating the diffusion of the field implant region downwardly and laterally inward. The lateral inward diffusion is undesirable as it adversely impacts the concentration of other types of materials which form the source and drain regions for the field effect transistors. The resulting lateral diffusion further results in dopant diffusion into active channel regions therefore affecting the body effects (of narrow width devices), threshold voltage instability, and higher junction leakage.

The formation of buried contact diffusion regions for use with thin film transistors have problems similar to that discussed above, that is, with buried contacts, the out diffusion of ions into the field oxide region degrades its isolation characteristics. In particular, the prior art practice, particularly in the fabrication of SRAM devices normally provides such buried contact regions into the bulk substrate prior to the provision of the thin film transistor layer. As will be recognized, subsequent thermal processing of the semiconductor wafer has the effect of diffusing the buried contact region downwardly and laterally inwardly thereby producing deleterious results. Still further, bulk well formation is normally provided after the deposit of a gate oxide and conductive gate layer. Subsequent thermal processing of the semiconductor device also results in the diffusion of the bulk well.

It would be desirable to improve upon the methods of forming diffusion type regions and bulk wells for devices such as thin film transistors, SRAMS, DRAMS, resistors in SRAMS, and similar assemblies. Such is the subject matter of the present invention.

BRIEF DESCRIPTION OF THE DRAWINGS

FIG. 7 is a view of the FIG. 6 wafer fragment shown at a processing step subsequent to that shown by FIG. 6.

FIG. 8 is a view of a semiconductor wafer fragment, of a second form of the invention, taken at one processing step in accordance with the present invention.

FIG. 13 is a view of the FIG. 12 wafer fragment shown at a processing step subsequent to that shown by FIG. 12.

FIG. 14 is a view of the FIG. 13 wafer fragment shown at a processing step subsequent to that shown by FIG. 13.

FIG. 17 is a view of the FIG. 16 wafer fragment shown at a processing step subsequent to that shown by FIG. 16.

FIG. 18 is a view of the FIG. 17 wafer fragment shown at a processing step subsequent to that shown by FIG. 17.

FIG. 21 is a view of the FIG. 20 wafer at a processing step subsequent to that shown in FIG. 20.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
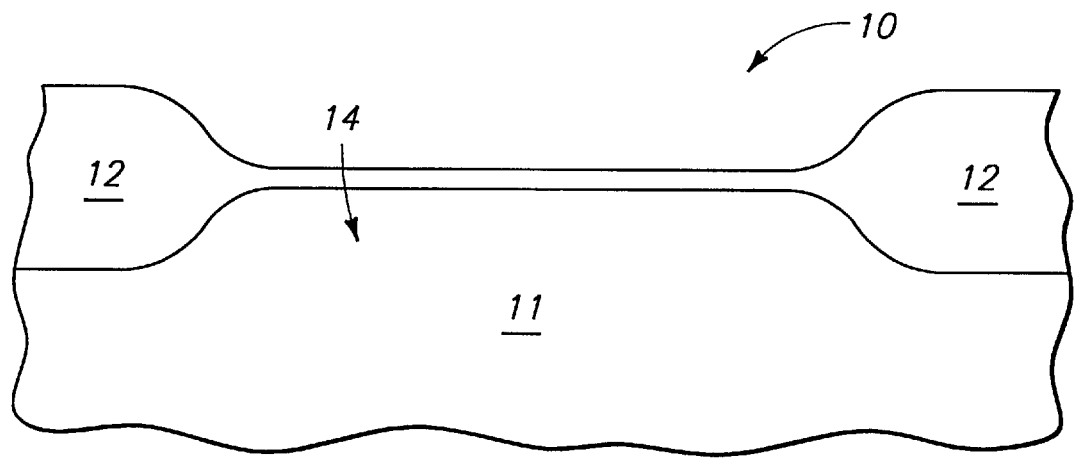
FIG. 1 is a view of a semiconductor wafer fragment taken at one processing step in accordance with the present invention.

Referring now to FIGS. 1 through 7, and initially to FIG. 1, there illustrated is a semiconductor wafer fragment in process and which is indicated generally by reference to numeral 10. In the context of this document, the term "semiconductor wafer fragment" or semiconductive substrate is defined to mean any construction comprising semiconductive material, including, but not limited to bulk semiconductive materials such as a semiconductive wafer (either alone or in assemblies comprising other materials thereon), and semiconductive material layers (either alone or in assemblies comprising other materials). The term "substrate" refers to any supporting structure, including but not limited to, the semiconductive substrates described above. This wafer fragment may be one portion of a static random access memory (SRAM cell or other electronic component). Such is provided in a bulk semiconductor substrate 11. The wafer fragment 10 is provided with field oxide regions 12. These field oxide regions are formed by conventional means. An active area 14 is defined adjacent the field oxide region 12.

Figure 2:
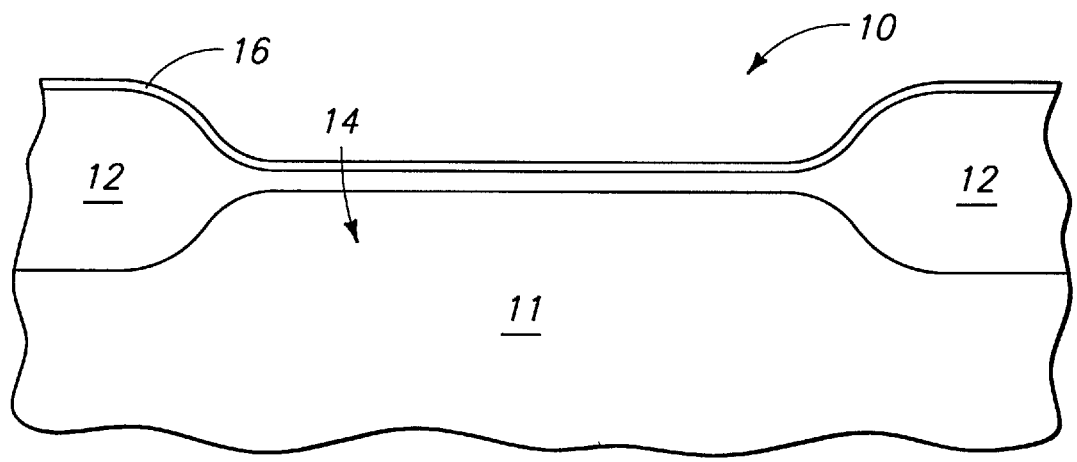
FIG. 2 is a view of the FIG. 1 wafer fragment shown at a processing step subsequent to that shown by FIG. 1.

Referring now to FIG. 2, a gate dielectric layer 16 is formed atop the bulk substrate 11 and in covering relation relative to the field oxide region 12, and the active area 14. This gate dielectric layer 16 preferably is silicon dioxide which is formed to a thickness of approximately 300 Angstroms.

Figure 3:
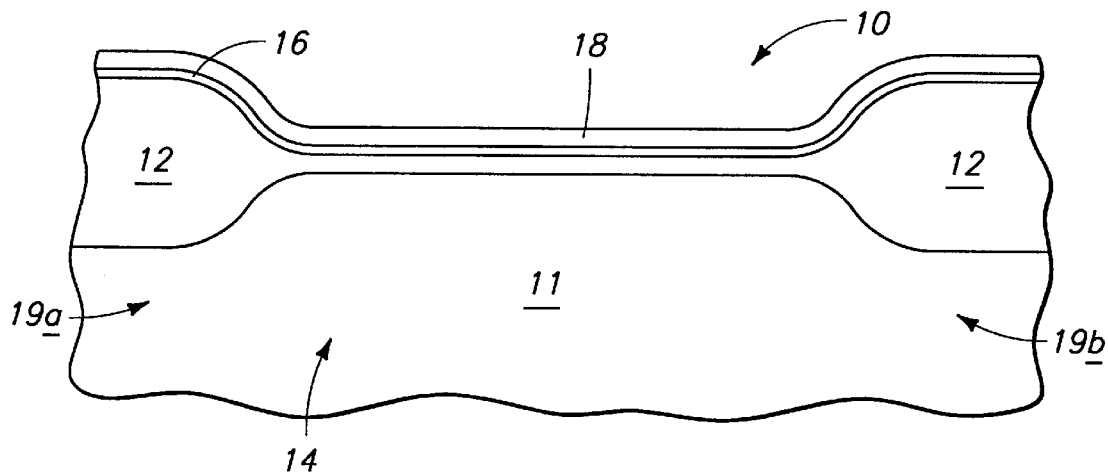
FIG. 3 is a view of the FIG. 2 wafer fragment shown at a processing step subsequent to that shown by FIG. 2.

Referring now to FIG. 3, a thin film transistor layer 18 is formed atop the gate dielectric layer 16 to a given thickness. The thin film transistor layer 18 would be subsequently patterned and doped with an impurity to provide source and drain regions 19a and 19b respectively.

Figure 4:
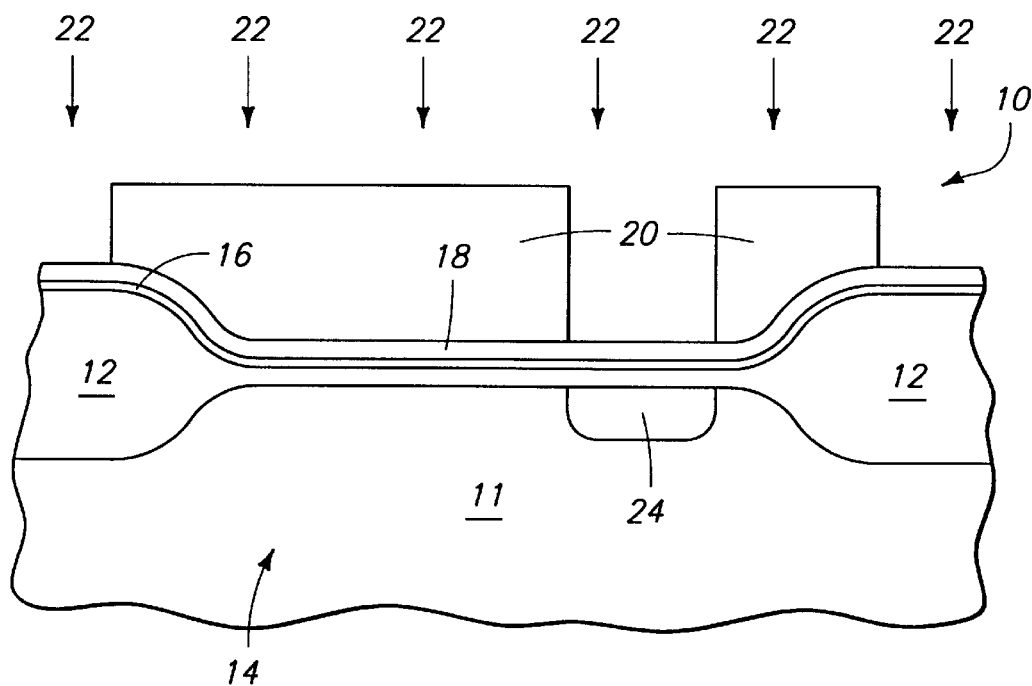
FIG. 4 is a view of the FIG. 3 wafer fragment shown at a processing step subsequent to that shown in FIG. 3.
Figure 5:
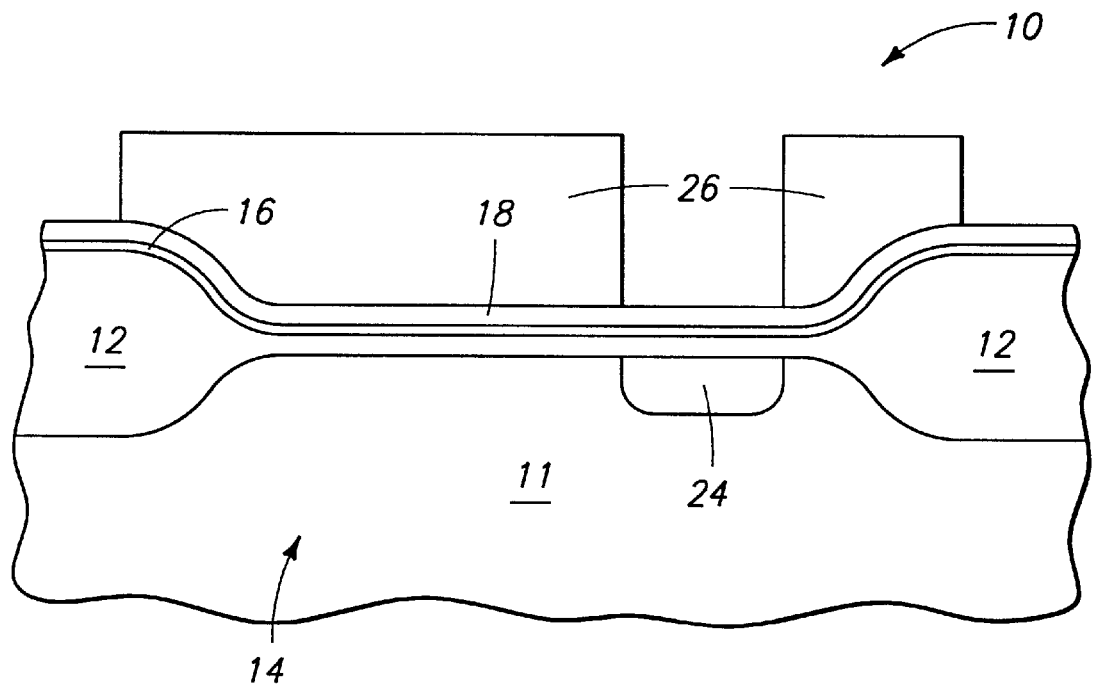
FIG. 5 is a view of the FIG. 4 wafer fragment shown at a processing step subsequent to that shown by FIG. 4.

Referring now to FIG. 4, a masking layer 20 is formed atop the thin film transistor layer and patterned in a given fashion, as shown. Thereafter, an ion discharge 22 is provided through the unmasked regions and through the thin film transistor layer 18 and underlying gate dielectric layer 16 to form a buried contact region 24 therebeneath. This first masking layer is then removed Referring now to FIG. 5, a second masking layer 26 is formed and which provides a masked area, and an unmasked area, which is substantially aligned with the buried contact region 24.

Figure 6:
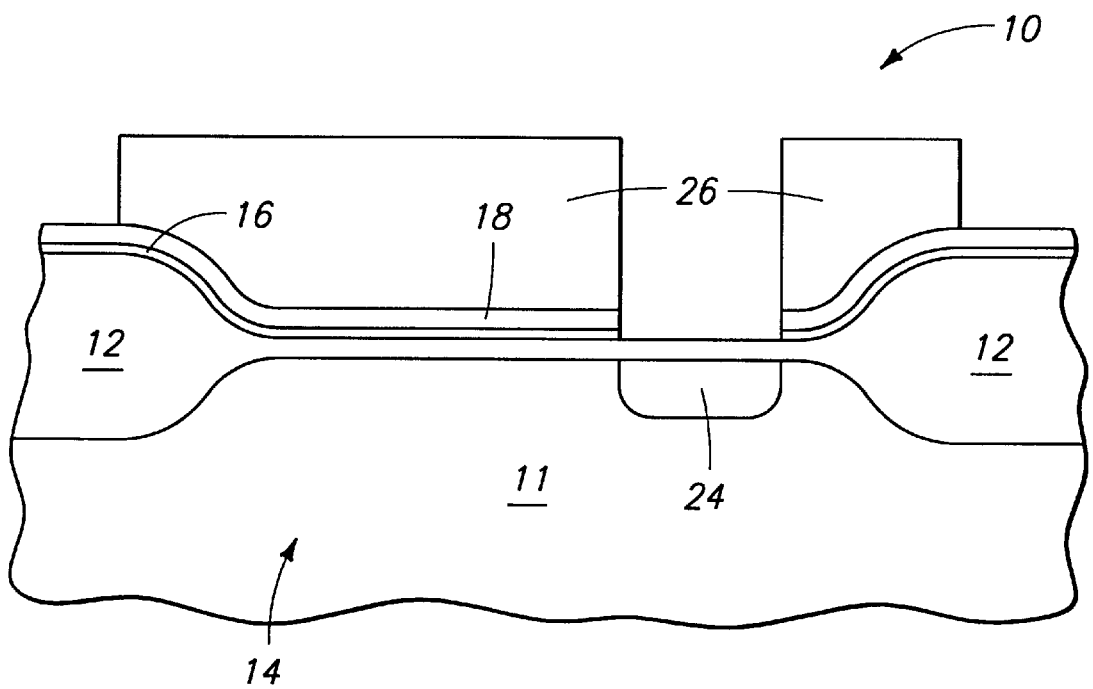
FIG. 6 is a view of the FIG. 5 wafer fragment shown at a processing step subsequent to that shown by FIG. 5.

As shown in FIG. 6, the method further includes etching the thin film transistor layer 18 and underlying gate dielectric layer 16 to expose the buried contact region 24 therebeneath.

Referring now to FIG. 7, a second electrically conductive layer 28 is formed atop the thin film transistor layer 18. This second electrically conductive layer 28 electrically couples the thin film transistor layer 18 and the buried contact diffusion region 24.

A second aspect of the present invention relates to the formation of a field implant region, and which facilitates the electrical isolation of a field effect transistor from adjoining electrical devices.

Referring now to FIG. 8, a semiconductor wafer 40 in process is shown. The semiconductor wafer is formed in a bulk substrate 41. As seen in FIG. 8, field oxide regions 42 are formed in a conventional fashion in the bulk substrate 41. The field oxide regions 42 define an active area region 44 adjacent thereto.

Figure 9:
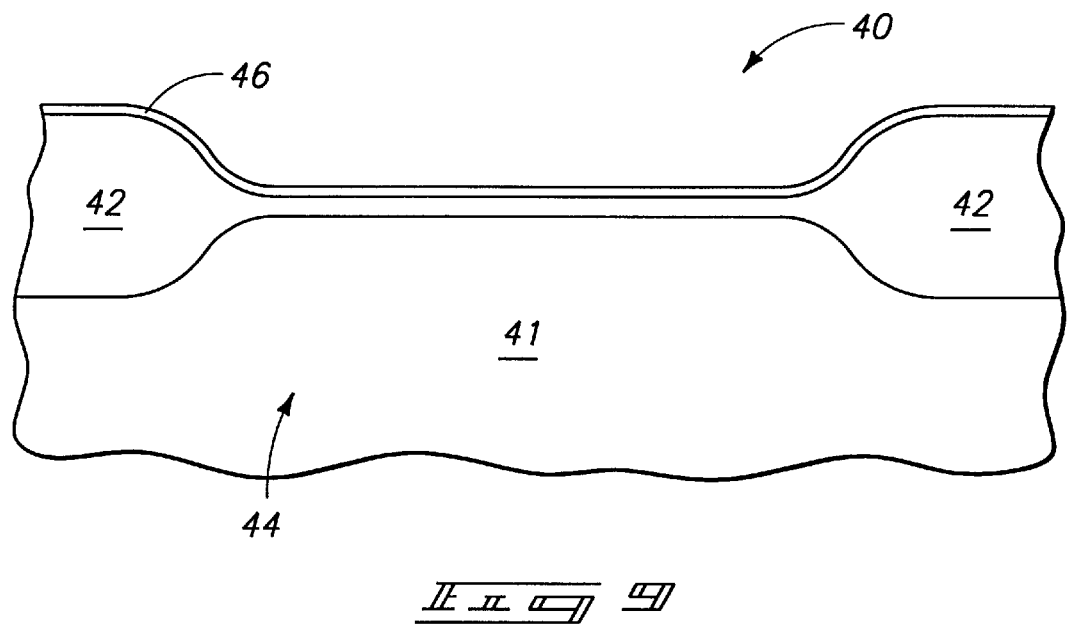
FIG. 9 is a view of the FIG. 8 wafer fragment shown at a processing step subsequent to that shown by FIG. 8.

Referring now to FIG. 9, a gate dielectric layer 46 is formed atop the exposed active area 44 and adjacent field oxide regions 42. The gate dielectric layer is similar to that discussed previously.

Figure 10:
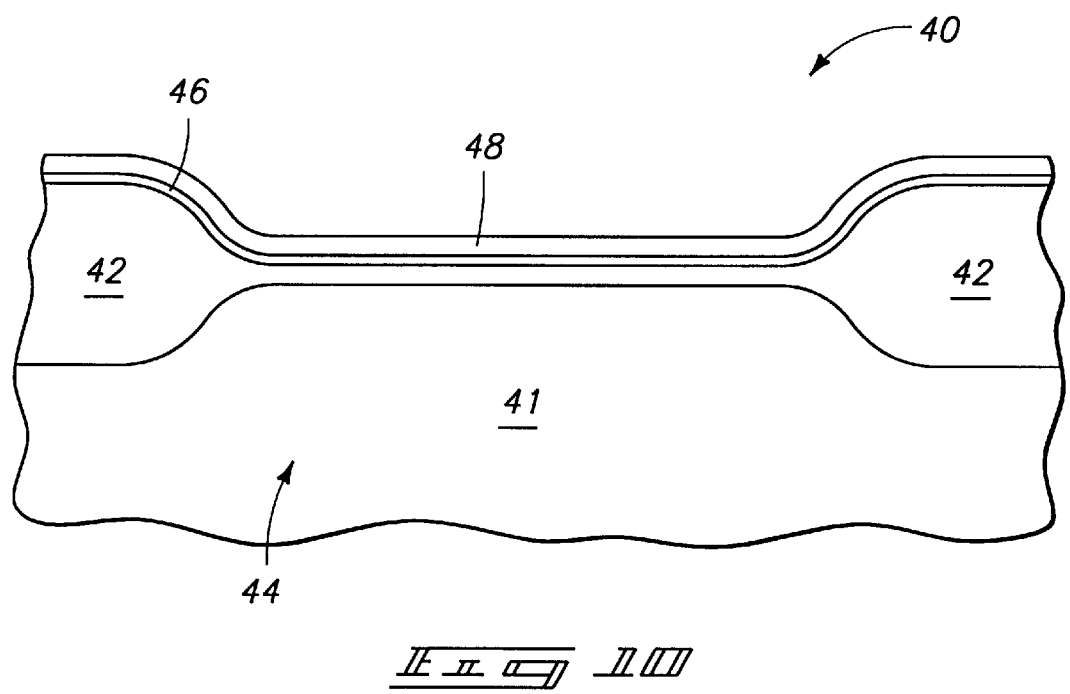
FIG. 10 is a view of the FIG. 9 wafer fragment shown at a processing step subsequent to that shown by FIG. 9.

Referring now to FIG. 10, a conductive gate layer 48 is formed atop the gate dielectric layer and adjacent field oxide regions 42.

Figure 11:
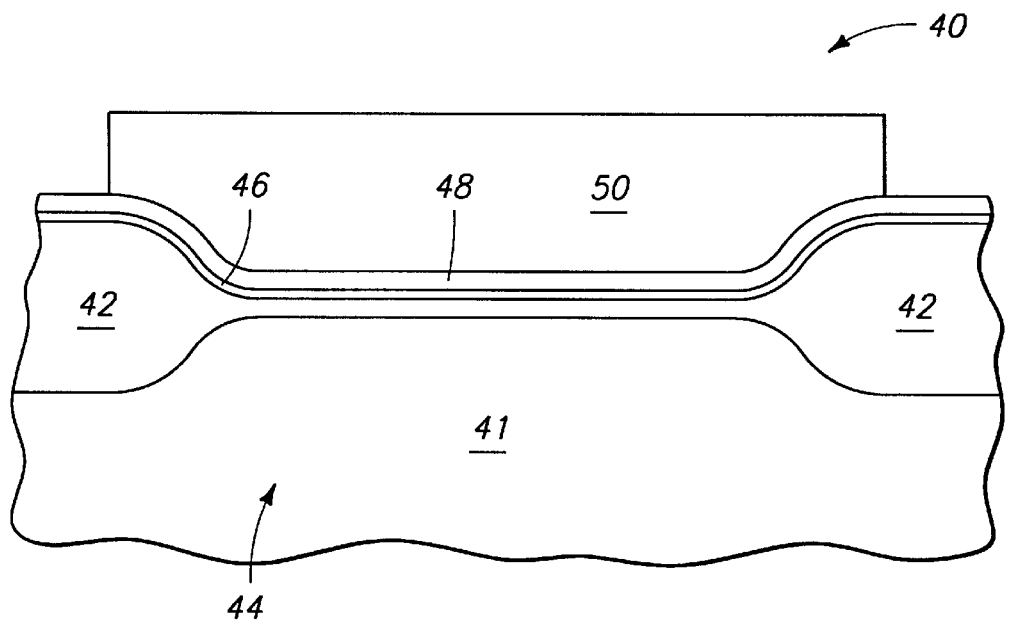
FIG. 11 is a view of the FIG. 10 wafer fragment shown at a processing step subsequent to that shown by FIG. 10.

Referring now to FIG. 11, a masking layer 50, comprising photoresist, is formed over the active area 44 while leaving the adjacent field oxide regions 42 unmasked.

Figure 12:
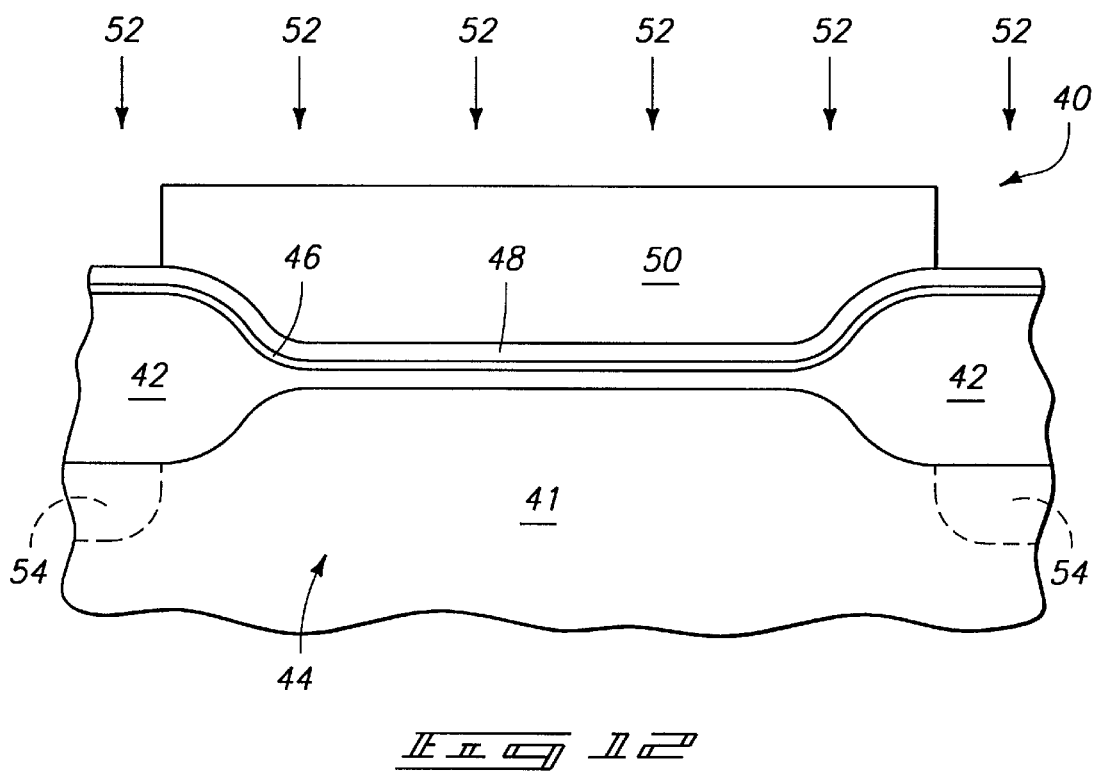
FIG. 12 is a view of the FIG. 11 wafer fragment shown at a processing step subsequent to that shown by FIG. 11.

As seen in FIG. 12 after the formation of the masking layer 50 ion implanting 52 is conducted. The ion implanting 52 comprises forming a dopant impurity through the conductive gate layer 48 and field oxide regions 42 and into the underlying substrate 41 to form a field implant region 54. The field implant region 54 facilitates the electrical isolation of one electrical device from an adjoining electrical device.

Referring now to FIG. 13, the masking layer 50 is shown removed.

As shown in FIG. 14, the method further comprises patterning and etching the conductive gate layer 48 to form a transistor gate within the active area region 44. Electrically conductive source and drain regions are provided operatively adjacent the gate 48.

A third aspect of the invention is best seen by reference to FIGS. 15 through 19, respectively.

Figure 15:
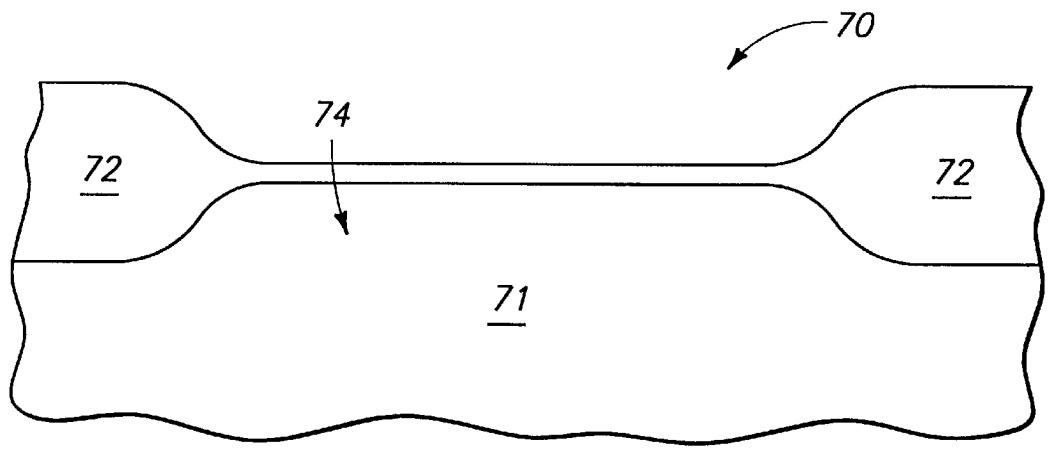
FIG. 15 is a view of a semiconductor wafer fragment of a third alternative form of the invention taken at one processing step in accordance with the present invention.

Referring now to FIG. 15, the semiconductor wafer in process is shown generally by the numeral 70. The wafer is formed in a bulk substrate 71 in a traditional fashion. As further shown in FIG. 15, field oxide regions 72 are formed, and an active area region 74 is formed adjacent thereto.

Figure 16:
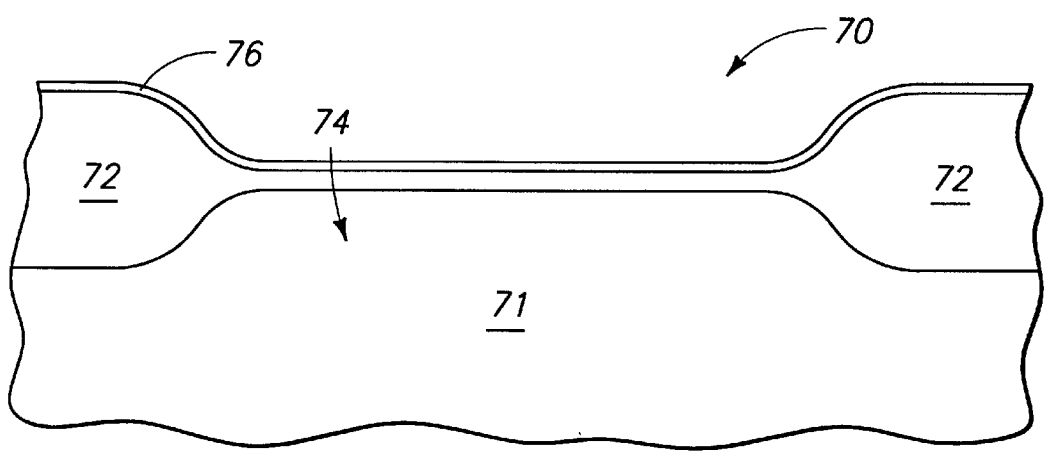
FIG. 16 is a view of the FIG. 15 wafer fragment shown at a processing step subsequent to that shown in FIG. 15.

Referring now to FIG. 16, a gate dielectric layer 76 is formed atop the semiconductor substrate 70, the gate dielectric layer 76 is similar to that discussed earlier in this application.

Referring now to FIG. 17, the semiconductor wafer 70 is shown in a step subsequent to that shown in FIG. 16, and wherein a conductive gate layer 78 is formed atop the gate dielectric layer 76.

Referring now to FIG. 18, conditions are provided effective to pattern and etch the conductive gate layer 78, as illustrated.

Figure 19:
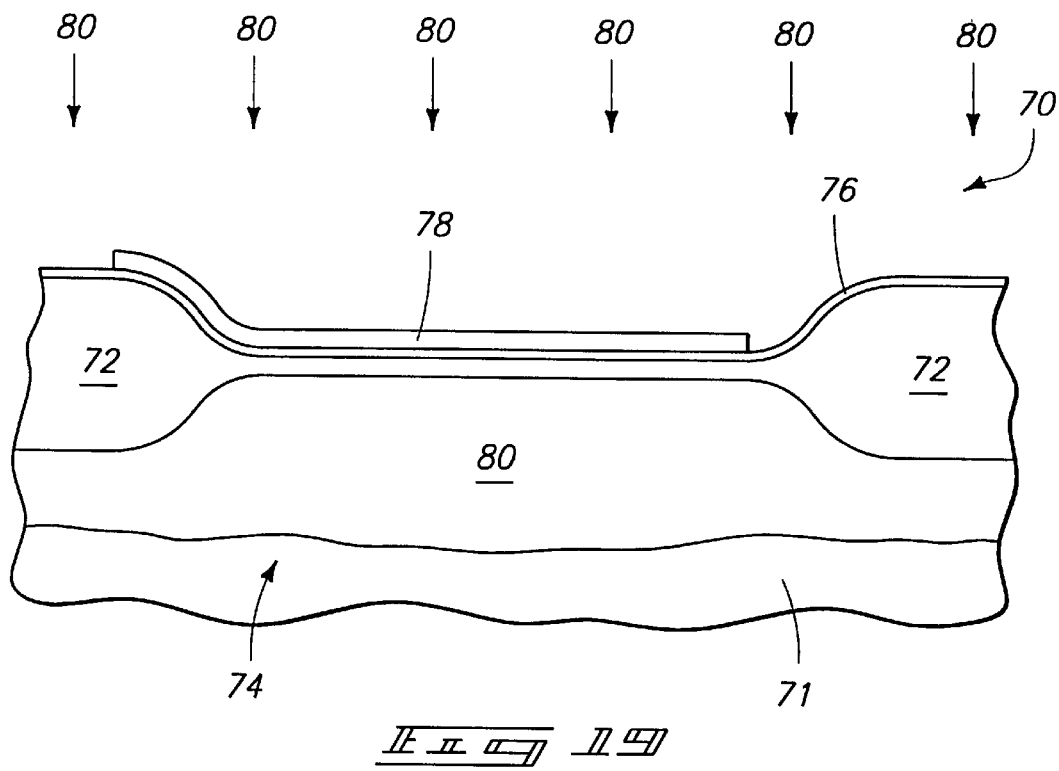
FIG. 19 is a view of the FIG. 18 wafer fragment shown at a processing step subsequent to that shown by FIG. 18.

Referring now to FIG. 19, and subsequent to the patterning and etching of the gate layer 78, an ion discharge 80 is provided to ion implant through the field oxide region 72, gate dielectric layer 76, and conductive gate layer 78 to form a background dopant well 80.

Figure 20:
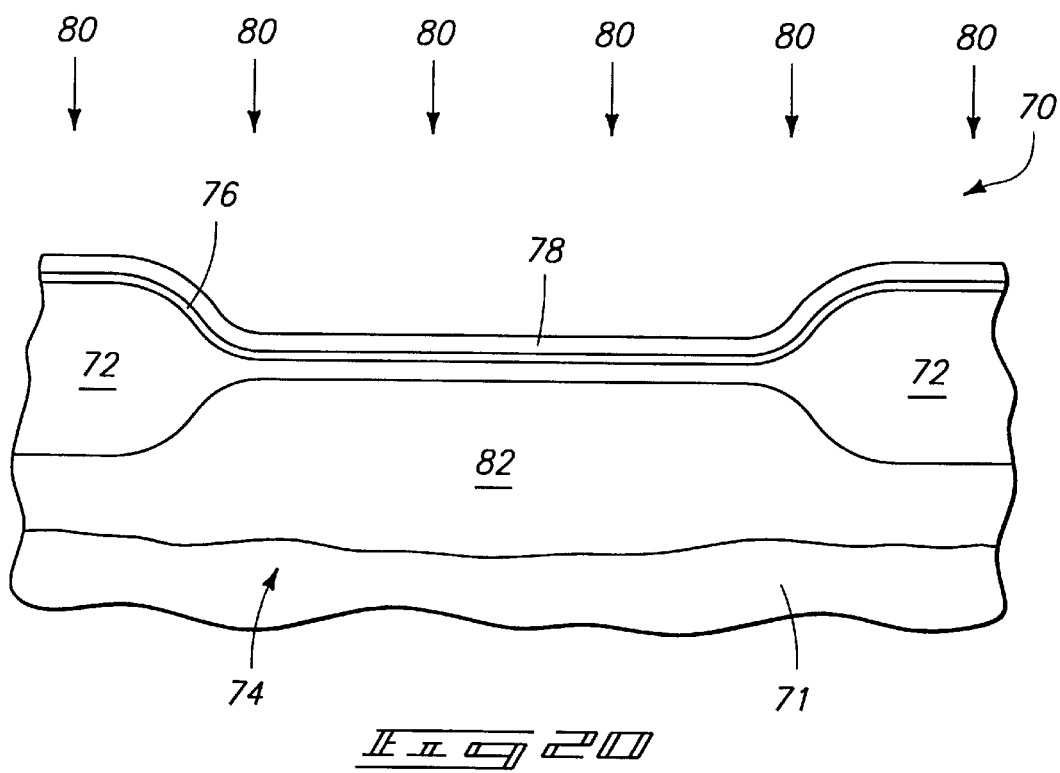
FIG. 20 is a view of FIG. 17 wafer taken at a processing step subsequent to that shown in FIG. 17.

Referring now to FIG. 20, the semiconductor wafer 70 is shown at a step subsequent to that shown in FIG. 17. In particular, in FIG. 20, after forming the conductive gate layer 78 an ion discharge 80 is provided to implant through the field oxide region 72, gate dielectric layer 76 and conductive gate layer 78 to form the background dopant well 82 as shown.

Referring now to FIG. 21, the gate dielectric layer 78 is shown in a step subsequent to FIG. 20 where it is patterned, and etched, as illustrated.

The method of the present invention is believed to be readily apparent and is briefly summarized at this point.

In accordance with one aspect of the present invention a semiconductor processing method for forming a diffusion region includes:

providing a semiconductor substrate 10;

forming a first layer of material 18 over the semiconductor substrate 10 which is electrically conductive, or subsequently rendered electrically conductive; and after forming the first layer, ion implanting 22 a conductivity modifying impurity through the first layer 18 and into the semiconductive substrate 10 to form a diffusion region 24 therein.

In accordance with another aspect of the invention, a method for forming a field effect transistor includes:

providing a substrate 40;

providing a field oxide region 42 and active area region 44 on the substrate 10;

forming a gate dielectric layer 46 atop the substrate 10 and within the active area region 44; and after forming the gate dielectric layer, ion implanting a dopant impurity 52 through the field oxide region 42 and into the underlying substrate to form a field implant 54 beneath the field oxide region 42 for facilitating electrical isolation of the field effect transistor from adjacent electrical devices.

Still another aspect of the present invention relates to a method for forming a field effect transistor which includes:

providing a substrate 40;

forming a field oxide region 42 on the substrate 40 and defining an exposed active area 44 adjacent thereto;

forming a gate dielectric layer 46 atop the exposed active area 44;

forming a conductive gate layer 48 over the gate dielectric layer 46 and adjacent field oxide region 42;

forming a masking layer 50 over the active area 44 while leaving the field oxide region 42 unmasked;

after forming the conductive gate layer 48, and with the masking layer 50 in place, ion implanting a dopant impurity 52 through the conductive gate layer 48 and field oxide region 42 and into the underlying substrate 40 to form a field implant 54 beneath the field oxide region 42 for facilitating electrical isolation of the field effect transistor from adjoining electrical devices;

patterning and etching the gate layer 48 to form a transistor gate within the active area region 44; and forming electrically conductive source and drain regions operatively adjacent the gate.

Still another aspect of the present invention relates to a method for forming a thin film transistor which includes:

providing a substrate 10;

forming a thin film transistor layer 18 atop the substrate 10; and after forming the thin film transistor layer 18, ion implanting 22 a dopant impurity through the thin film transistor layer 18 and into the underlying substrate t o provide a buried contact diffusion region 24 beneath the thin film transistor layer 18.

Still a further aspect of the present invention relates to a semiconductor processing method for forming a background dopant well 80 relative to a semiconductor material substrate 70, and which includes:

providing a semiconductor substrate 70;

22 forming a field oxide region 72 on the semiconductor substrate 70;

forming a gate dielectric layer 76 atop the semiconductor substrate 70;

forming a conductive gate layer 78 atop the gate dielectric layer 76; and after the step of forming the conductive gate layer, ion implanting 80 through the field oxide region 72, gate dielectric layer 76 and conductive gate layer 78 to form a background dopant well 80.

In compliance with the statute, the invention has been described in language more or less specific as to structural and methodical features. It is to be understood, however, that the invention is not limited to the specific features shown a nd described, since the means herein disclosed comprise preferred forms of putting the invention into effect. The invention is, therefore, claimed in any of its forms or modifications within the proper scope of the appended claims appropriately interpreted in accordance with the Doctrine of Equivalents.

I claim:

1. A semiconductor processing method, comprising:

providing a semiconductive substrate;

forming a field oxide region on the semiconductive substrate, the field oxide region defining an active area adjacent thereto on the semiconductive substrate;

forming a gate dielectric layer atop the semiconductive substrate and in covering relation relative to the field oxide region and the active area;

forming a thin film transistor layer atop the gate dielectric layer and in covering relation relative to the field oxide and active area regions;

after forming the thin film transistor layer, forming source and drain regions in the active area region;

forming a first masking layer in partial covering relation relative to the active area to define an unmasked active area region, and in covering relation relative to the field oxide regions;

ion implanting through the unmasked active area region and through the thin film transistor and gate dielectric layers to form a buried contact region in the semiconductive substrate;

removing the first masking layer; and forming a second masking layer atop the thin film transistor layer, the second masking layer providing a masked area, and an unmasked area, and wherein the unmasked area is substantially aligned with the buried contact region;

removing the thin film transistor layer and the gate dielectric layer in the unmasked area to expose the buried contact region therebeneath;

removing the second masking layer; and forming an electrically conductive layer on the thin film transistor layer and which electrically couples the thin film transistor layer and the buried contact region which is formed in the semiconductive substrate.

2. A semiconductor processing method, comprising:

providing a semiconductive substrate;

forming a field oxide region on the semiconductive substrate, the field oxide region defining an active area adjacent thereto on the semiconductive substrate;

forming a gate dielectric layer atop the active area and adjacent field oxide region;

forming a conductive gate layer atop the dielectric layer and in covering relation relative to the active area and adjacent field oxide region;

forming a masking layer over the active area while leaving the adjacent field oxide region unmasked;

after formation of the masking layer, ion implanting a dopant impurity through the conductive gate layer, gate dielectric layer and field oxide region and into the underlying semiconductive substrate to form a field implant region;

removing the masking layer to expose the conductive gate layer; patterning and etching the conductive gate layer to form a transistor gate within the active area region; and forming electrically conductive source and drain legions in the semiconductive substrate and operatively adjacent the transistor gate.

3. A semiconductor processing method comprising:

providing a semiconductive substrate;

forming a field oxide region on the semiconductive substrate, the field oxide region defining an active area adjacent thereto on the semiconductive substrate;

after forming the field oxide region, forming a gate dielectric layer atop the semiconductive substrate and in covering relation relative to the field oxide region and the active area;

after forming the gate dielectric layer, forming a conductive gate layer atop the gate dielectric layer and in covering relation relative to the field oxide region and active area;

after forming the conductive gate layer, patterning and etching the conductive gate layer to form a resulting conductive gate; and subsequent to the patterning and etching of the conductive gate layer, ion implanting through the resulting conductive gate to form a background dopant well in the semiconductive substrate.

4. A semiconductor processing method comprising:

providing a semiconductive substrate;

forming a field oxide region on the semiconductive substrate, the field oxide region defining an active area adjacent thereto on the semiconductive substrate;

after forming the field oxide region, forming a ,ate dielectric layer atop the semiconductive substrate and in covering relation relative to the field oxide region and the active area;

after forming the gate dielectric layer, forming a conductive gate layer atop the gate dielectric layer and in covering relation relative to the field oxide region and active area;

subsequent to forming the conductive gate layer, ion implanting through the conductive gate layer, gate dielectric layer, and field oxide region to form a background dopant well in the semiconductive substrate; and patterning and etching the conductive gate layer to form a resulting conductive gate.

* * * * *

UNITED STATES PATENT AND TRADEMARK OFFICE
CERTIFICATE OF CORRECTION

PATENT NO. : 5,943,579
DATED : August 24, 1999
INVENTOR(S) : Luan C. Tran

It is certified that error appears in the above-identified patent and that said Letters Patent is hereby corrected as shown below:

In column 1, line 8, after "(ARPA).", please insert --The--

In column 5, line 53, at the beginning of the line, delete "22"

In column 5, line 67, at the end of the line, delete "a"

In column 6, line 1, at the beginning of the line, delete "nd" and insert --and--

In column 8, line 6, delete ",ate" and insert --gate--

Signed and Sealed this

Twenty-second Day of February, 2000

Q. TODD DICKINSON

Attest:

*Attesting Officer*  *Commissioner of Patents and Trademarks*